United States Patent [19]
Hayafuji et al.

[11] Patent Number: 6,037,242
[45] Date of Patent: *Mar. 14, 2000

[54] METHOD OF MAKING HETERO-STRUCTURE

[75] Inventors: Norio Hayafuji; Yoshitsugu Yamamoto, both of Tokyo, Japan

[73] Assignee: Mitsubishi Denki Kabushiki Kaisha, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/892,994

[22] Filed: Jul. 15, 1997

[30] Foreign Application Priority Data

Mar. 6, 1997 [JP] Japan ............... P-09-070787

[51] Int. Cl.[7] .................................................. H01L 21/20
[52] U.S. Cl. ..................... 438/483; 438/480; 438/482; 438/509; 257/187; 257/190
[58] Field of Search ..................... 257/187, 190; 438/482, 483, 480, 509; 117/8

[56] References Cited

U.S. PATENT DOCUMENTS

| | | | |
|---|---|---|---|
| 5,053,843 | 10/1991 | Choudhury et al. | 357/30 |
| 5,371,387 | 12/1994 | Ando | 257/192 |
| 5,411,914 | 5/1995 | Chen et al. | 437/107 |
| 5,525,538 | 6/1996 | Twigg et al. | 437/105 |
| 5,633,516 | 5/1997 | Mishima et al. | 257/190 |
| 5,751,030 | 5/1998 | Fujimoto et al. | 257/190 |

FOREIGN PATENT DOCUMENTS

| | | |
|---|---|---|
| 2003937 | 1/1990 | Japan . |
| 3046241 | 2/1991 | Japan . |
| 4162539 | 6/1992 | Japan . |
| 5347245 | 12/1993 | Japan . |
| 6177037 | 6/1994 | Japan . |

OTHER PUBLICATIONS

Ueda et al., "Effects of the Substrate Offset Angle on the Growth of GaAs on Si Substrate", Japanese Journal of Applied Physics, vol. 25, No. 9, Sep. 1986, pp. L789–L790.

Hayafuji et al., "Improvement of InP Crystal Quality on GaAs Substrates by Thermal Cyclic Annealing", Japanese Journal of Applied Physics, vol. 28, No. 10, Oct. 1989, pp. L1721–L1724.

Hayafuji et al., "Large Scale MOCVD Growth of GaAs–On–Si by Atomic Layer Epitaxy Using Intial Buffer Layers", North–Holland Physics Publishing, reprinted from Journal of Crystal Growth, vol. 106, 1990, pp. 421–425.

Chen et al., "A High Performance $0.12\mu m$ T–Shape Gate $Ga_{0.5}In_{0.5}As/Al_{0.5}In_{0.5}As$ Modfet Grown by MBE Lattice Mis–Matched on a GaAs Substrate", International Electron Devices Meeting, 17.7, pp. 431–434, Dec. 6–9, 1987.

Mishima et al., "High $G_m In_{0.5}Al_{0.5}As/In_{0.5}Ga_{0.5}As$ High Electron Mobility Transistors Grown Lattice–Mismatched on GaAs Substrates", Journal of Crystal Growth 150, pp. 1230–1235, 1995.

Primary Examiner—Olik Chaudhuri
Assistant Examiner—Douglas A. Wille
Attorney, Agent, or Firm—Leydig, Voit & Mayer, Ltd.

[57] ABSTRACT

A method of preparing an AlInAs/GaAs hetero-structure includes forming an $Al_{1-x}In_xAs$ (0<x<1) buffer layer in an amorphous state on a GaAs substrate, annealing the amorphous buffer layer to crystallize the buffer layer into a single crystal buffer layer, and forming a single crystal $Al_{1-x'}In_{x'}As$ (0<x'<1) active layer on the single crystal buffer layer.

7 Claims, 9 Drawing Sheets

25 µm

GaInAs(P)/AlInAs LASER DIODE

GaInAs/AlInAs HEMT
GaAs/AlGaAs LASER DIODE

METHOD OF MAKING HETERO-STRUCTURE

BACKGROUND OF THE INVENTION

1. Field of the Invention

The present invention relates to a semiconductor hetero-structure having a low dislocation density, and a method for producing the same.

2. Description of the Prior Art

An attempt has recently been made to grow a GaInAs/AlInAs type HEMT on a GaAs substrate, which is cheaper than an InP substrate and is also superior in strength, in place of an InP substrate.

However, the lattice constant of GaAs is 5.6533 Å while each lattice constant of $Ga_{0.47}In_{0.53}As$ and $Al_{0.48}In_{0.52}As$ to be grown on the InD, is 5.8688 Å. Therefore, there is always a lattice mismatch of about 4% between GaAs the $Ga_{0.47}In_{0.53}As$ or $Al_{0.48}In_{0.52}As$ and thus $Ga_{0.47}In_{0.53}As$ grown directly on a GaAs substrate has a large concentration of crystal defects caused by the lattice mismatch.

In order to solve such a problem, for example, as shown in a cross-sectional view of FIG. 16, there are grown, in order, on a GaAs substrate 1, an undoped GaAs layer 13 having a thickness of 20 nm to an undoped AlAs layer 14 having a thickness of 20 nm, and an undoped AlInAs layer 15 having a thickness of not less than 330 nm, wherein the composition ratio x of $Al_{1-x}In_xAs$ is changed in steps within the range from 0.15 to 0.45, to alleviate the lattice mismatch. Thereafter an undoped $Al_{0.55}In_{0.45}As$ barrier layer 11 having a thickness of 20 nm, an undoped $Ga_{0.55}In_{0.45}As$ channel layer 3 having a thickness of 30 nm, an $Al_{0.55}In_{0.45}As$ first spacer layer 4 having a thickness of 2 nm, a Si-doped $Al_{0.55}In_{0.45}As$ electron supplying layer 8 having a thickness of 2 nm, and an $Al_{0.55}In_{0.45}As$ Schottky spacer layer 8 having a thickness of 10 nm are sequentially grown. Finally, there is formed an ohmic contact layer 16 of a three layer structure having GaInAs/AlInAs/GaInAs, thereby forming GaInAs/AlInAs HEMTs on the GaAs substrate while inhibiting generation of crystal defects caused by lattice mismatch (Journal of Crystal Growth 150 (1995) pp1230–1235).

Such a method of changing the composition ratio x of $Al_{1-x}In_xAs$ gives HEMTs formed on the GaAs substrate decreased lattice mismatch and have improved electron mobility of 8,800 cm²/Vs at room temperature, substantially the same as that an HEMT formed on an InP substrate. However, the HEMT formed on the GaAs substrate still has a worse surface condition than an HEMT formed on an InP substrate, causing diffuse reflection and a pattern of cross-hatching caused by microcracks and crystal defects observed in a surface differential interference microphotograph. Such crystal defects make the HEMT quality worse, according to a test of applying a current between the source and drain at 190° C., with respect to transconductance (gm) and saturated drain current (Idss), the HEMT formed on the InP substrate showed no deterioration during 500 hours or more while the HEMT formed on the GaAs substrate showed deterioration such as a decrease to 90% or less during 3 hours, which means it is difficult to put the HEMT formed on the GaAs substrate into practical.

Accordingly, a first object of the present invention is to provide an AlInAs/GaAs or GaInAs/GaAs hetero-structure suitable for an HEMT.

Further, a second object of the present invention is to provide a method of preparing an AlInAs/GaAs or GaInAs/GaAs hetero-structure suitable for an HEMT.

SUMMARY OF THE INVENTION

According to a first aspect of the present invention, there is provided a semiconductor hetero-structure for a pseudomorphic HEMT comprising;

a GaAs substrate;

an $Al_{1-x}In_xAs$ (0<x<1) or $Ga_{1-y}In_yAs$ (0<y<1) buffer layer formed on said GaAs substrate; and an $Al_{1-x'}In_{x'}As$ (0<x'<1) or $Ga_{1-y'}In_{y'}As$ active layer (0<y'<1) formed on said $Al_{1-x}In_xAs$ or $Ga_{1-y}In_yAs$ buffer layer, wherein said $Al_{1-x}In_xAs$ (0<x<1) or $Ga_{1-y}In_yAs$ (0<y<1) buffer layer is single-crystallized from an amorphus layer of $Al_{1-x}In_xAs$ (0<x<1) or $Ga_{1-y}In_yAs$ (0<y<1) layer formed on said GaAs substrate.

According to the present invention, formation of a single crystal buffer layer on a GaAs substrate due to crystallization of GaInAs or AlInAs in an amorphous state, can make lattice-misfit dislocations confined to the buffer layer, so that a GaInAs layer or an AlInAs layer to be formed on said GaAs substrate can be produced with little crystal defects, despite of lattice-matching with the GaAs substrate.

In a preferred embodiment of the semiconductor hetero-structure for a pseudomorphic HEMT according to the present invention, said $Al_{1-x}In_xAs$ (0<x<1) or $Ga_{1-y}In_yAs$ (0<y<1) buffer layer may be substantially the same composition as that of said $Al_{1-x'}In_{x'}As$ (0<x'<1) or $Ga_{1-y'}In_{y'}As$ (0<y'<1).

In this case, "substantially the same composition" means the composition with no occurrence of lattice-misfit dislocations on the growth of the deposit of said active layer on said buffer layer.

Furthermore, said active layer formed on the buffer layer has a lower dislocation density than that of the buffer layer, because the buffer layer serves for confining the lattice misfit dislocations therein in a loop shape.

According to a general aspect of the present invention, said buffer layer has a film thickness of 5 to 20 nm because such a thickness makes the lattice misfit dislocation effectively confined into the buffer layer.

Said buffer layer may comprise a plurality of uniform compositional films.

According to a second aspect of the present invention, there can be provided a semiconductor device comprising;

an AlInAs/GaAs or GaInAs/GaAs hetero-structure substrate comprising an $Al_{1-x}In_xAs$ (0<x<1) or $Ga_{1-y}In_yAs$ (0<y<1) single crystal buffer layer formed on said GaAs substrate and an $Al_{1-x'}In_{x'}As$ (0<x'<1) or $Ga_{1-y'}In_{y'}As$ active layer (0<y'<1) formed on said $Al_{1-x}In_xAs$ or $Ga_{1-y}In_yAs$ buffer layer;

at least one device selected from the group consisting of active devices and passive devices formed on said AlInAs/GaAs or GaInAs/GaAs hetero-structure substrate, wherein said $Al_{1-x}In_xAs$ (0<x<1) or $Ga_{1-y}In_yAs$ (0<y<1) buffer layer is single-crystallized from an amorphus layer of $Al_{1-x}In_xAs$ (0<x<1) or $Ga_{1-y}In_yAs$ (0<y<1) layer formed on said GaAs substrate.

In an embodiment for forming an electronic device and an optical device on a single substrate, said GaAs substrate may be provided with at least one hetero-structure portion comprising an $Al_{1-x}In_xAs$ (0<x<1) or $Ga_{1-y}In_yAs$ (0<y<1) single crystal buffer layer formed on said GaAs substrate and an $Al_{1-x'}In_{x'}As$ (0<x'<1) or $Ga_{1-y'}In_{y'}As$ active layer (0<y'<1) formed on said $Al_{1-x}In_xAs$ or $Ga_{1-y}In_yAs$ buffer layer;

at least one device selected from the group consisting of active devices and passive devices formed on said AlInAs/

GaAs or GaInAs/GaAs hetero-structure portions. Particularly, in case of forming more than two hetero-structure portions on the same substrate, different hetero-structure can be formed on the same substrate.

According to a third aspect of the present invention, there can be provided a method of preparing an AlInAs/GaAs or GaInAs/GaAs hetero-structure on a GaAs substrate, which comprises steps of;

forming a deposit of $Al_{1-x}In_xAs$ (0<x<1) or $Ga_{1-y}In_yAs$ (0<y<1) buffer layer in an amorphous state on said GaAs substrate, annealing said deposit at a predetermined temperature to crystallize said amorphous layer into a single crystal layer, forming a single crystal layer of $Al_{1-x'}In_{x'}As$ (0<x'<1) or $Ga_{1-y'}In_{y'}As$ active layer (0<y'<1) on said $Al_{1-x}In_xAs$ or $Ga_{1-y}In_yAs$ buffer layer.

In a preferred embodiment, said annealing step may include at least one heat-cool cycle of heating said deposit from a deposit forming temperature to said annealing temperature and cooling the deposit from said annealing temperature to said deposit forming temperature so as to provide said deposit with a heat stress, because the heat stress can help a loop formation of the misfit dislocations. Further, said annealing may be carried out at a temperature of 450° C. or more, where the loop formation can be promoted.

DETAILED DESCRIPTION OF THE INVENTION

Embodiment 1

Figure 1:
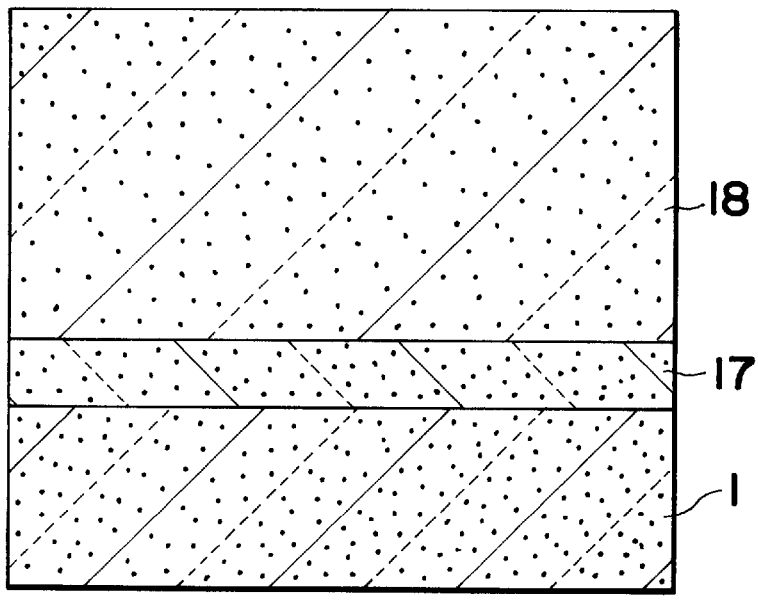
FIG. 1 is a cross-sectional view showing a structure wherein a buffer layer is formed between a GaAs substrate and an $Al_{0.48}In_{0.52}As$ layer according to Embodiment 1 of the present invention.

FIG. 1 is a cross-sectional view showing a semiconductor hetero-structure wherein, in an $Al_{0.48}In_{0.52}$ layer 18 on a GaAs substrate 1 a buffer layer 17 which absorbs and blocks lattice-misfit dislocations due to lattice mismatch between GaAs and $Al_{0.48}In_{0.52}As$ is arranged between the aforementioned GaAs substrate and the $Al_{0.48}In_{0.52}As$ layer 18. In FIG. 1, 1 indicates a GaAs substrate, 17 indicates an $Al_{0.48}In_{0.52}As$ buffer layer which absorbs and blocks almost all lattice-misfit dislocations, and 18 indicates an undoped $Al_{0.48}In_{0.52}As$ layer.

Figure 2:
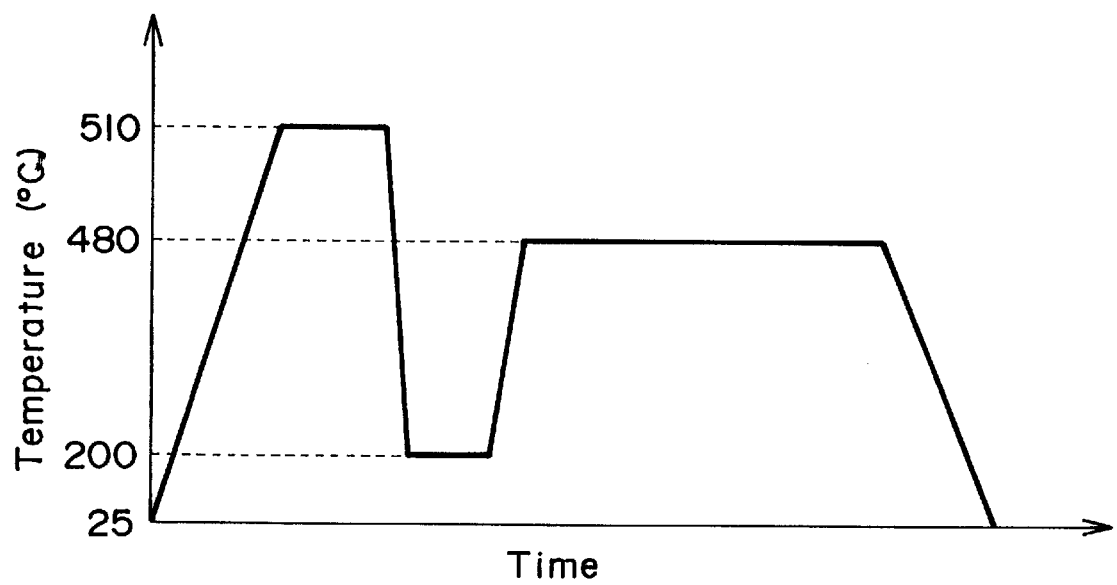
FIG. 2 is a graph showing a temperature sequence of the growth of an $A_{0.48}In_{0.52}As$ layer on a GaAs substrate using a buffer layer according to Embodiment 1 of the present invention.

In order to produce such a hetero-structure, first of all, the GaAs substrate 1 is placed in a MBE (molecular beam epitaxy) apparatus and is heated to 510° C., as shown in FIG. 2, for change thermal cleaning for removing an oxide film formed on the surface of the substrate 1.

Then, the substrate temperature is once lowered to 200° C. and only maintained at 200° C., followed by irradiation with As Al Ga and In beams deposit an $Al_{0.48}In_{0.52}As$ buffer layer 17 having a thickness of 10 nm. Since the buffer layer 17 on the GaAs substrate 1 has a low growth temperature of 200° C., the buffer layer 17 is an amorphous layer and lattice-misfit dislocations are not formed in the buffer layer in spite of the presence of lattice mismatch (about 4%) between the buffer layer and the GaAs substrate 1. In place of lattice-misfit dislocations, a large amount of twins, stacking faults, etc. are formed.

After irradiation by Al, Ga, and In beams is interrupted and the deposition of the buffer layer 17 is terminated, the substrate temperature is raised to 480° C. With respect to the buffer layer 17 in the aforementioned amorphous state, crystallization referred generally to as "solid phase epitaxial growth" occurs as a result of such thermal hysterisis and buffer layer 17 is converted into a single crystal. Since the buffer layer 17 is converted into the single crystal, lattice-misfit dislocations are introduced into the buffer layer 1 7 for relieving the lattice mismatch (about 4%) between the buffer layer and the GaAs substrate 1. However, such lattice-misfit dislocations are to loop in the process of conversion into single crystal and are confined to the buffer layer 17.

Since the thickness of the buffer layer 17 is small, atoms actively move in the buffer layer 17 and the rearrangement of atoms results in disappearance of defects (e.g. twins, stacking faults, etc.) which were present in the amorphous state.

Lastly, Al, Ga, and In beams are irradiated again while maintaining the substrate temperature at 480° C. to grow an undoped $Al_{0.48}In_{0.52}As$ layer 18 having a thickness of 0.6 µm, and the substrate temperature is lowered to complete the production of the hetero-structure.

Figure 3:
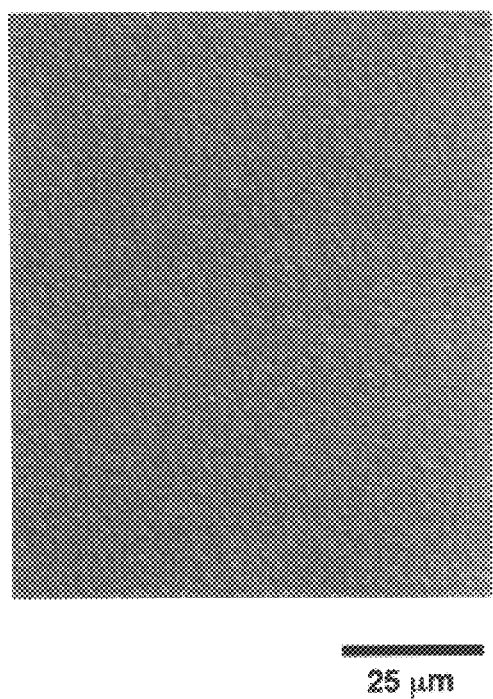
FIG. 3 is a surface differential interference microphotograph of an $A_{0.48}In_{0.52}As$ layer on a GaAs substrate using a buffer layer according to Embodiment 1 of the present invention.

FIG. 3 is a surface differential interference microphotograph of the hetero-structure shown in FIG. 1.

Figure 17:
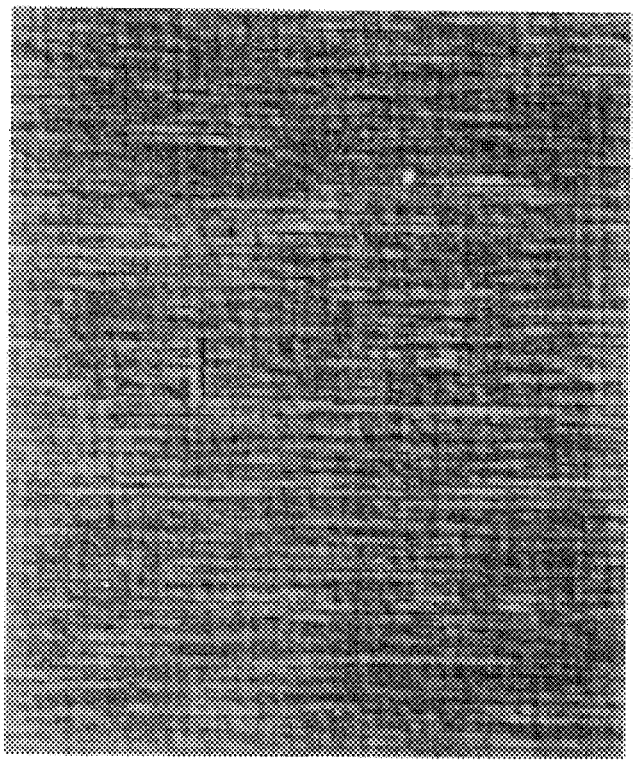
FIG. 17 is a surface differential interference microphotograph of a GaInAs/AlInAs HEMT on a conventional GaAs substrate.

As is apparent from a comparison with the surface differential interference microphotograph of an HEMT produced by a conventional method and shown in FIG. 17, the unevenness on the surface of the crystal is drastically decreased and, at the same time, a cross-hatched pattern as an aggregate of microcracks, defects, etc., which causes a fatal defect in a practical use, is not generated at all over the whole surface of a wafer having a diameter of 3 inches.

By confining lattice-misfit dislocations to the buffer layer 17 formed on the GaAs substrate, it becomes possible to form an $Al_{0.48}In_{0.52}As$ layer 18 with few crystal defects such as dislocation, etc. on the GaAs substrate 1.

Embodiment 2

In the aforementioned Embodiment 1, the growth temperature of the $Al_{0.48}In_{0.52}As$ buffer layer 17 was set to 200° C. and the thickness of the layer 17 was set to 10 nm. In Embodiment 2, in order to examine optimum conditions, the buffer layer was formed on the GaAs substrate by changing the deposition temperature of the buffer layer 17 within the range from 50 to 480° C. and changing the thickness of the buffer layer 17 within the range from 0 to 50 nm, and a buffer layer 17 was recrystallized. Furthermore, an undoped $Al_{0.48}In_{0.52}As$ layer 18 having a thickness of 0.6 µm was formed and a surface state (unevenness) and a full width at half maximum of DCXR (two crystal X ray refraction evaluation) were examined. The step of growing the crystal on the GaAs substrate 1 is the same as that in Embodiment 1.

Figure 4:
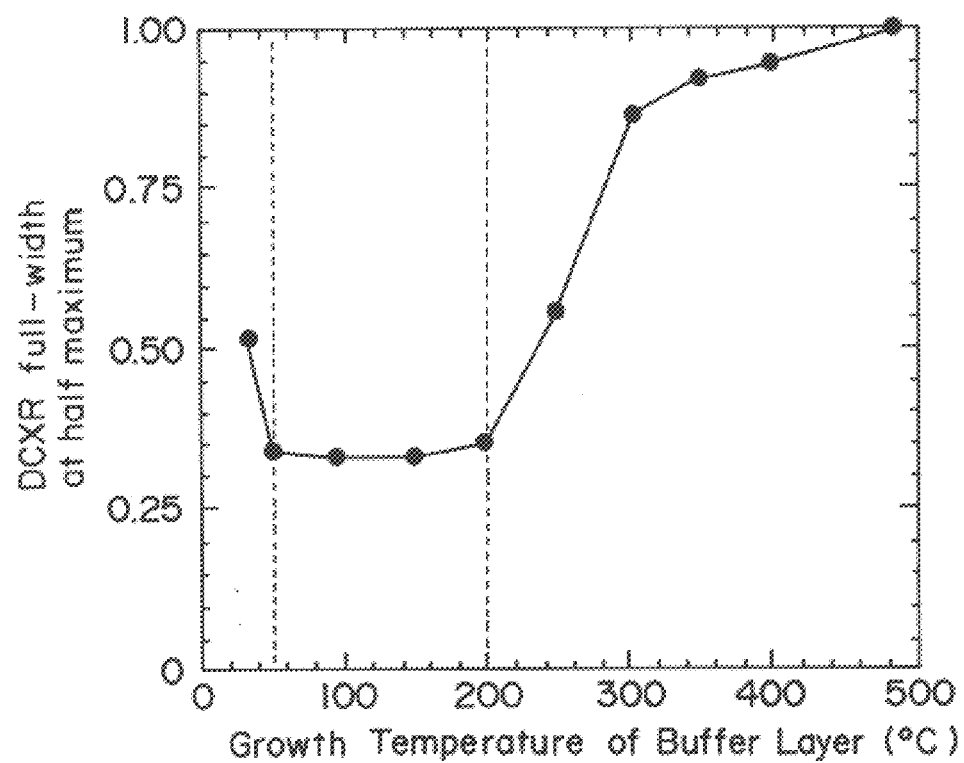
FIG. 4 is a graph showing a relation between the buffer layer growth temperature and the DCXR full width at half maximum in the growth of an $A_{0.48}In_{0.52}As$ layer on an GaAs substrate according to Embodiment 2 of the present invention.
Figure 5:
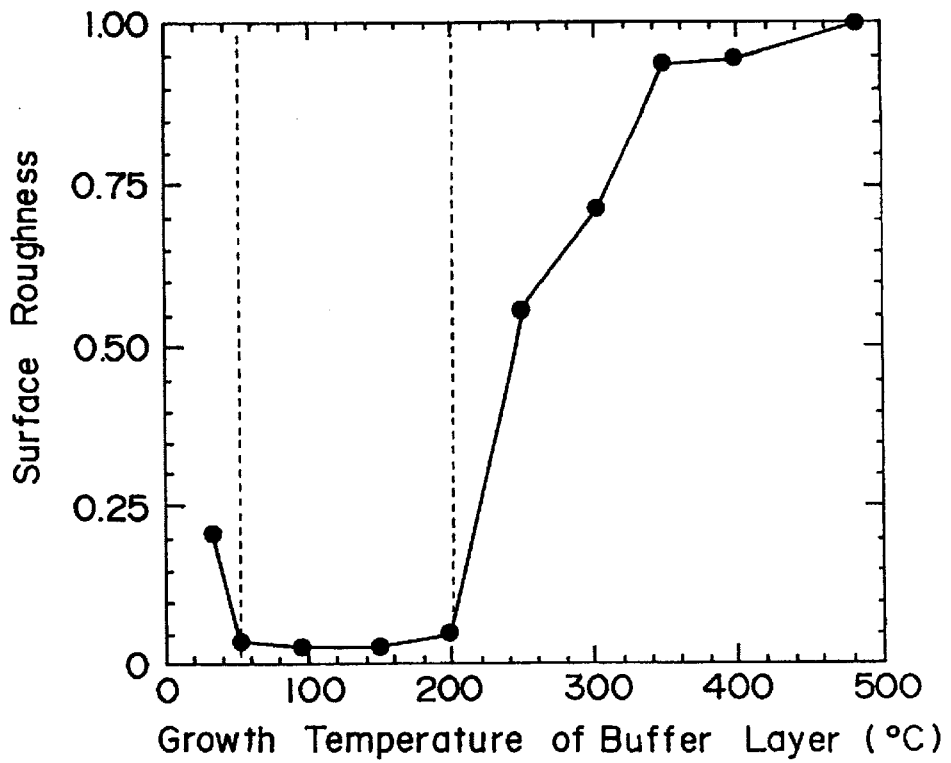
FIG. 5 is a graph showing a relation between growth temperature of the buffer layer and the surface unevenness in growth of an $Al_{0.48}In_{0.52}As$ layer on a GaAs substrate according to Embodiment 2 of the present invention.
Figure 6:
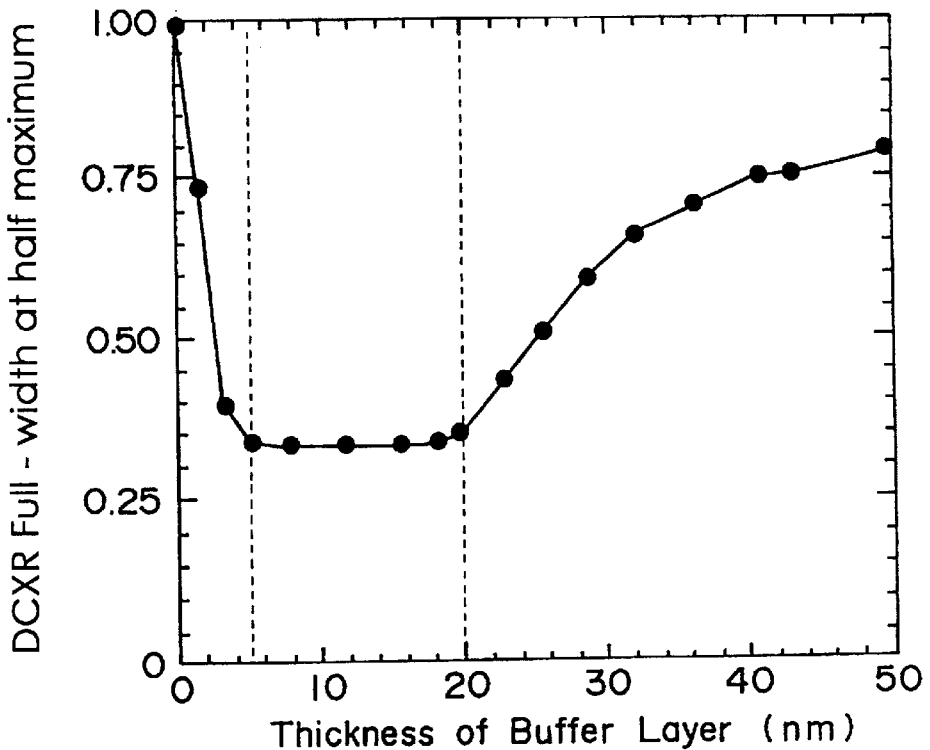
FIG. 6 is a graph showing a relation between the growth temperature of the buffer layer and the DCXR full width at half maximum in the growth of an $Al_{0.48}IN_{0.52}As$ layer on a GaAs substrate according to Embodiment 2.
Figure 7:
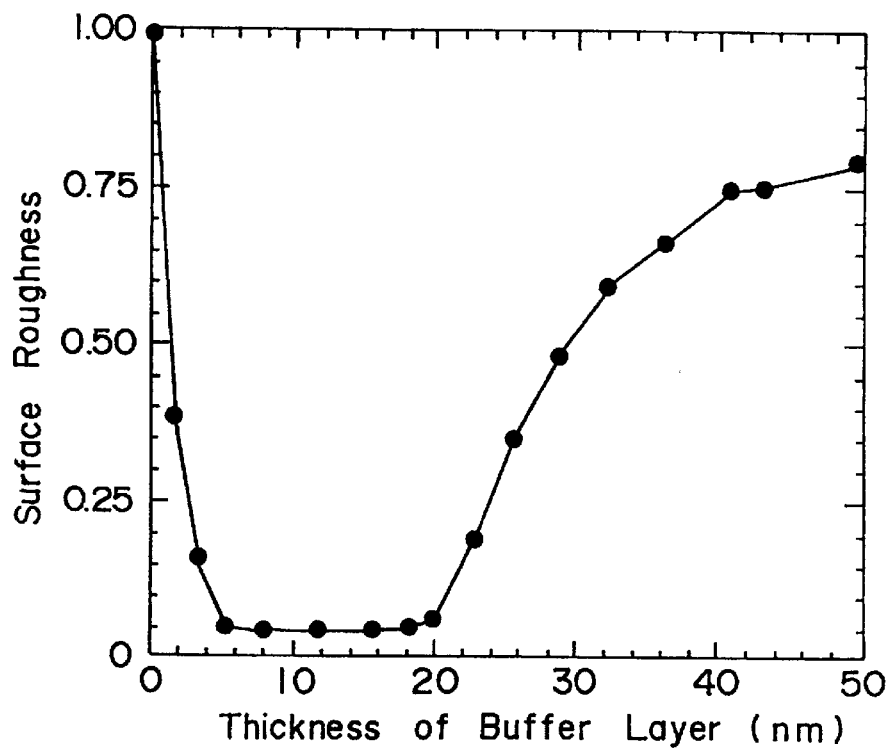
FIG. 7 is a graph showing a relation between growth temperature of the buffer layer and the surface unevenness in growth of an $Al_{0.48}In_{0.52}As$ layer on a GaAs substrate according to Embodiment 2.

FIG. 4 and FIG. 5 respectively show a relation between the buffer layer growth temperature, the DCXR full width at half maximum, and the surface unevenness where the thickness of the buffer layer is 20 nm, while FIG. 6 and FIG. 7 show a relation between the thickness of the buffer layer 17, the DCXR full width at half maximum, and the surface unevenness in case where the growth temperature of the buffer layer 17 is 200° C.

As is apparent from FIG. 4 and FIG. 5, where the thickness of the buffer layer is 20 nm, the DCXR full width at half maximum and surface unevenness are better when the buffer layer growth temperature is not more than 200° C. Within such a condition range, lattice-misfit dislocations are absorbed and blocked in the buffer layer 17 and the quality of the $Al_{0.48}In_{0.52}As$ layer 18 on the buffer layer 17 can be improved.

As is apparent from FIG. 6 and FIG. 7, where the growth temperature of the buffer layer 17 is 200° C., the DCXR full width at half maximum and surface unevenness become good when the thickness of the buffer layer 17 is within the range from 5 to 20 nm. Within such a condition range, lattice-misfit dislocations are absorbed and blocked in the buffer layer 17 and the quality of the $Al_{0.48}In_{0.52}As$ layer 18 formed on the buffer layer 17 can be improved.

As is apparent from these results, by setting the thickness of the buffer layer within the range from 5 to 20 nm, lattice-misfit dislocations can be effectively absorbed and blocked in the buffer layer and the quality of the $Al_{0.48}In_{0.52}As$ layer 18 formed on the buffer layer 17 can be improved.

Embodiment 3

In Embodiment 1 and Embodiment 2, the $Al_{0.48}In_{0.52}As$ buffer layer 17 was formed on the GaAs substrate 1 and, after interrupting the crystal growth, the substrate temperature was raised to 480° C. to convert the buffer layer 17 into a single crystal. In order to examine the optimal condition of the method for raising the temperature, the surface state and the full width at half maximum of DCXR (double crystal X ray diffraction evaluation) were compared and examined between two cases, e.g. a case where the substrate temperature was raised to 480° C. after continuously depositing the buffer layer at 200° C. and the undoped $Al_{0.48}In_{0.52}As$ layer 18 was continuously grown without annealing and a case where the deposition of the buffer layer at 200° C. was once interrupted and, after annealing one to five times at an substrate temperature of 480° C., the undoped $Al_{0.48}In_{0.52}As$ layer 18 was grown at 480° C.

Figure 8:
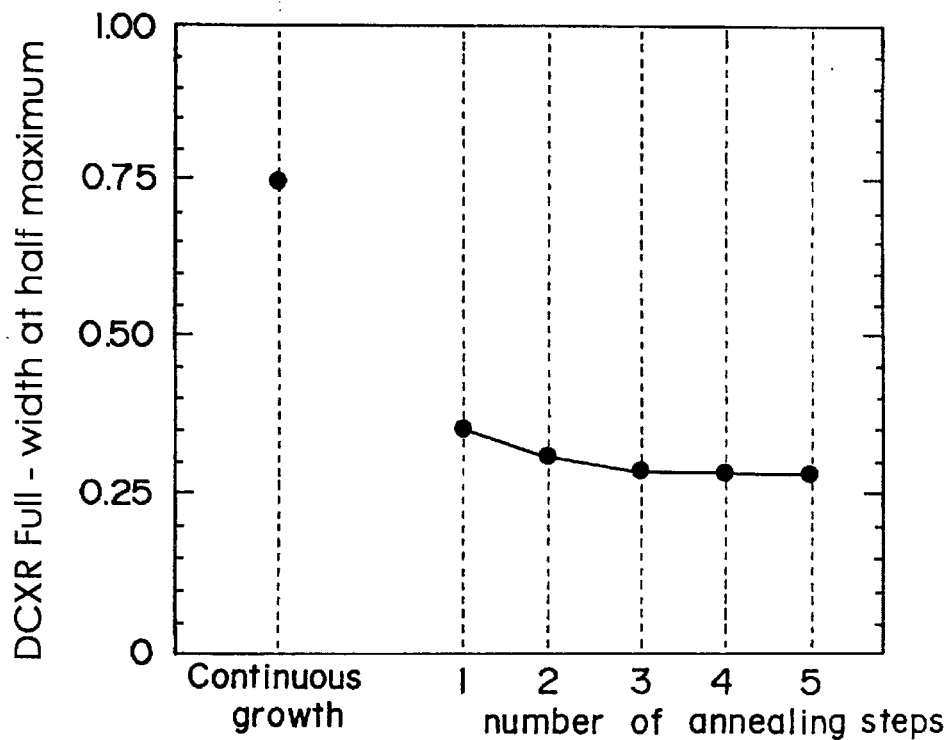
FIG. 8 is a graph showing a relation between the buffer layer annealing condition and the DCXR full width at half maximum in the growth of an $Al_{0.48}In_{0.52}As$ layer on a GaAs substrate according to Embodiment 3 of the present invention.
Figure 9:
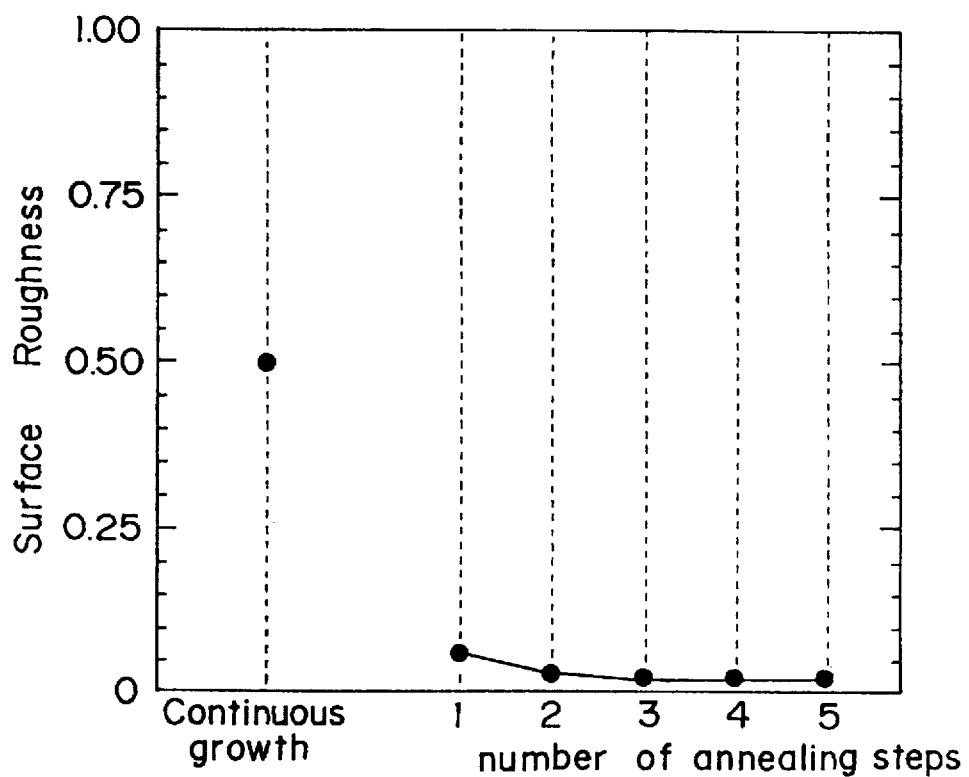
FIG. 9 is a graph showing a relation between the buffer layer annealing condition and surface unevenness in the growth of an $Al_{0.48}In_{0.52}As$ layer on a GaAs substrate according to Embodiment 3.

The DCXR full width at half maximum and the surface unevenness, obtained where the $Al_{0.48}In_{0.52}As$ layer 18 was continuously grown without annealing and case where the $Al_{0.48}In_{0.52}As$ layer 18 was grown after annealing one to five times (the step of lowering the temperature to 200° C. immediately after raising the temperature to 450° C. is repeated one to five times) are shown in FIG. 8 and FIG. 9. The deposition temperature of the buffer layer 17 is 200° C. and the thickness of the layer 17 is 20 nm.

As is apparent from FIG. 8 and FIG. 9, the crystal quality of the undoped $Al_{0.48}In_{0.52}As$ layer 18 is poor but the crystal quality is improved by annealing at least once and the crystal quality is further improved by repeating an increase/decrease in annealing temperature.

This reason is considered as follows. A thermal stress is applied to the buffer layer 17 by repeating the increase/decrease in annealing temperature so that the applied thermal stress promotes looping of lattice-misfit dislocations.

Embodiment 4

Figure 10:
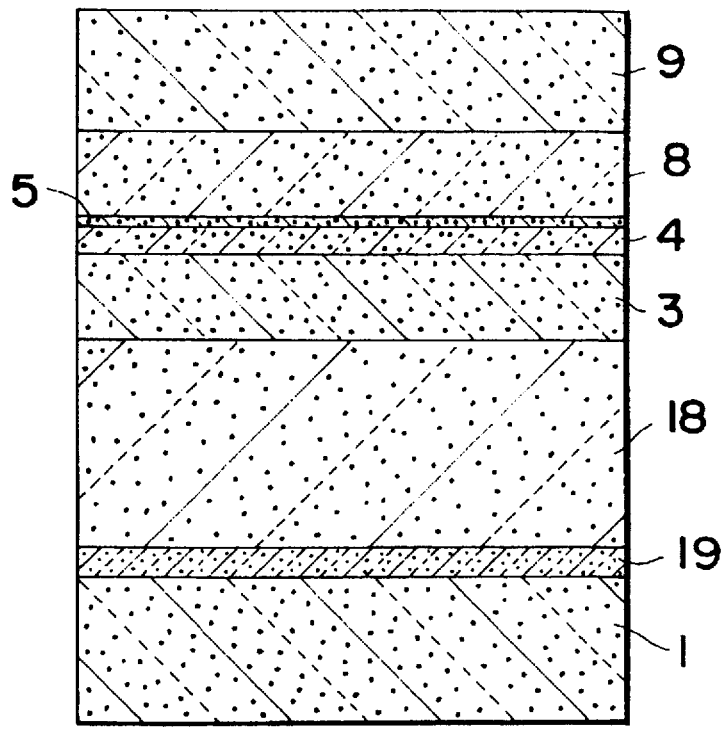
FIG. 10 is a cross-sectional view showing a $Ga_{0.47}In_{0.53}As/Al_{0.48}In_{0.52}As$ HEMT structure on a GaAs substrate using a buffer layer according to Embodiment 4 of the present invention.

FIG. 10 is a cross-sectional view showing a structure of a $Ga_{0.47}In_{0.53}As/Al_{0.48}In_{0.52}As$ HEMT having a single crystal buffer layer on a GaAs substrate, produced the method according to Embodiment 1.

In FIG. 10, 1 indicates a GaAs substrate, 19 indicates an $Al_{0.48}In_{0.52}As$ buffer layer having a thickness of 20 nm, which absorbs and blocks almost all of lattice-misfit dislocations, 18 indicates an undoped $Al_{0.48}In_{0.52}As$ layer having a thickness of 0.6 µm, 3 indicates an undoped $Ga_{0.47}In_{0.53}As$ channel layer having a thickness of 50 nm, 4 indicates an $Al_{0.48}In_{0.52}As$ spacer layer having a thickness of 2 nm, 5 indicates a planar-doped Si layer, 8 indicates an undoped $Al_{0.48}In_{0.52}As$ Schottky layer having a thickness of 32 nm, and 9 indicates a Si-doped $Ga_{0.47}In_{0.53}As$ ohmic contact layer having a thickness of 50 nm.

In the aforementioned HEMT, since the crystal growth layer is grown further than in Embodiment 1, the surface state is further improved and the surface unevenness is about 80% of the surface state unevenness of FIG. 3. Furthermore, microcracks and cross-hatching were not observed at all.

Then, the Si-doped $Ga_{0.47}In_{0.53}As$ ohmic contact layer 9 of the aforementioned HEMT was selectively removed and a Hall measurement was conducted at room temperature. As a result, the mobility was 9100 $cm^2/Vs$, that is a good value which is the same as that in a conventional case was obtained.

Furthermore, currant flowed on between the source and the drain of the aforementioned HEMT and an a test at 190° C. was conducted under the same conditions as for an change by to according to HEMT produced by the prior art. As a result, transconductance (gm) and saturated drain current under zero bias hold a value of 90% or more, that is, a value whose reduction rate is not more than 10%, until 300 hours have passed.

Figure 16:
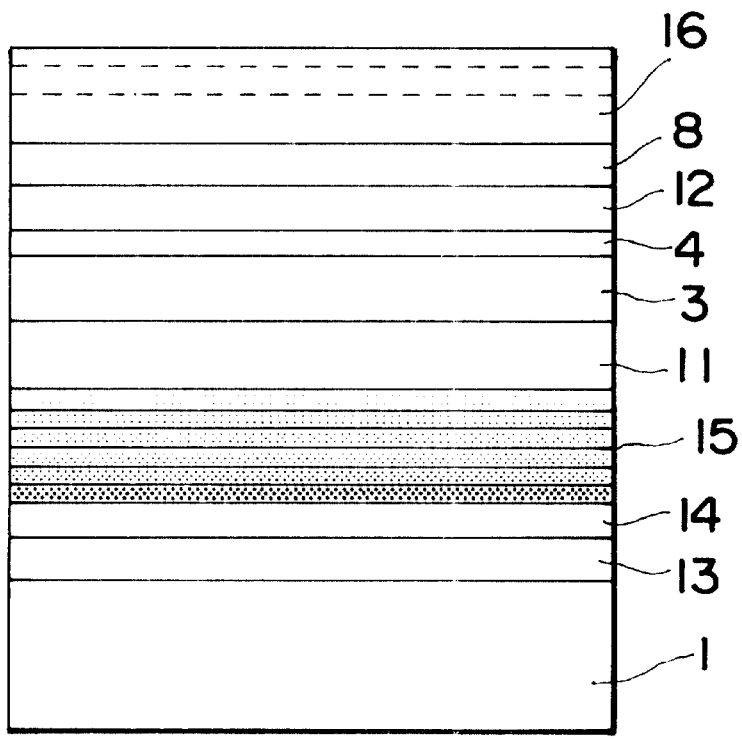
FIG. 16 is a cross-sectional view showing a structure of GaInAs/AlInAs HEMT on a conventional GaAs substrate.

Lastly, in order to confirm that the improvement in device characteristics is caused by the improvement in crystal quality, a comparison in defect distribution by means of TEM (transmission electron microscopy) observation of the cross section between the HEMT structure according to Embodiment 3 shown in FIG. 10 and a conventional HEMT structure shown in FIG. 16 was made.

Figure 11:
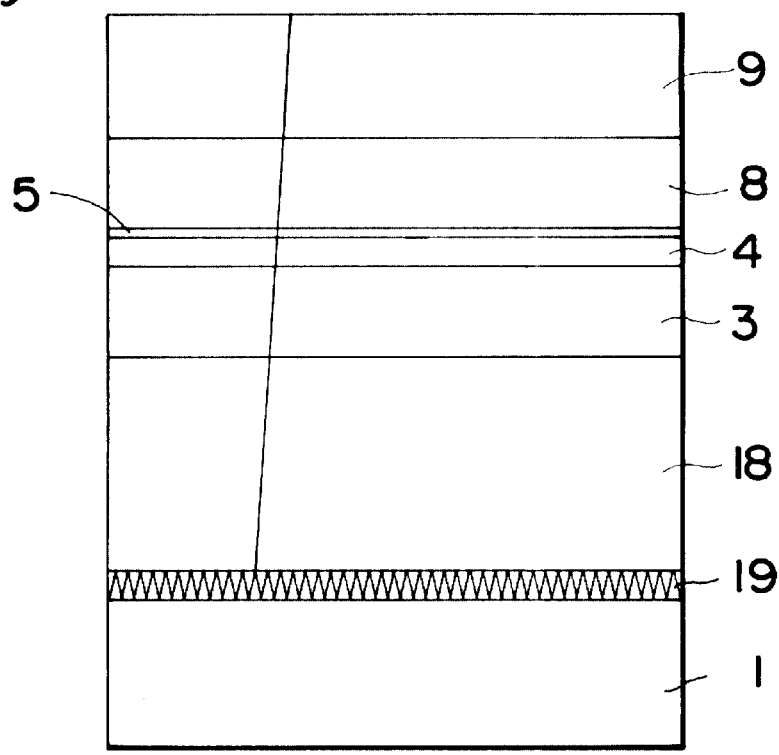
FIG. 11 is a cross-sectional view showing a TEM observation sketch of a $Ga_{0.47}In_{0.53}As/Al_{0.48}In_{0.52}As$ HEMT structure on a GaAs substrate using a buffer layer according to Embodiment 4.
Figure 12:
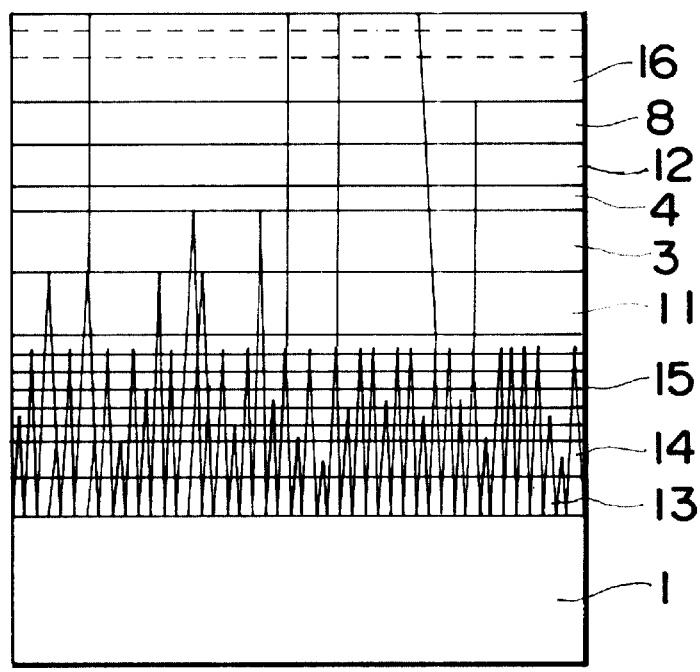
FIG. 12 is a cross-sectional view showing a TEM observation sketch of a $Ga_{0.47}In_{0.53}As/Al_{0.48}In_{0.52}As$ HEMT structure on a GaAs substrate according to the prior art.

FIG. 11 is a cross-sectional view showing a defect distribution sketch of the HEMT structure (FIG. 10) of Embodiment 3 by means of TEM observation of the cross section, while, FIG. 12 is a cross-sectional view showing a defect distribution sketch of a conventional HEMT structure shown in FIG. 16 by means of TEM observation of the cross section. In FIG. 11, almost all lattice-misfit dislocations formed due to lattice mismatch of the GaAs/AlInAs are confined to the $Al_{0.48}In_{0.52}As$ buffer layer so that twins and stacking faults are not observed. On the other hand, in FIG. 12, a part of lattice-misfit dislocations extend to the active layer through the undoped GaAs layer having a thickness of 28 nm, the undoped AlAs layer 14 having a thickness of 20 nm, and the undoped $Al_{1-x}In_xAs$ layer 15 having a film thickness of not less than 330 nm wherein an InAs composition ratio x is changed in steps within the range from 0.15 to 0.45, and twin and stacking fault are also detected.

In such way, in Embodiment 4, it is possible to confine lattice-misfit dislocations due to lattice mismatch of the GaAs substrate and AlInAs to the buffer layer 19. Consequently, no influence of lattice misfit dislocations is exerted on the active region of the HEMT on the upper part of the buffer layer 19. Thus, it becomes possible to obtain good device characteristics and good device reliability.

As the device formed on the aforementioned positive region an HBT may be formed in addition to an HEMT.

Embodiment 5

When using the buffer layer produced in Embodiment 1, Embodiment 3, and Embodiment 4, it is possible to form a good-quality GaInAs/AlInAs semiconductor hetero-structure on at least one part of the GaAs substrate on which another semiconductor hetero-structure is lattice-matched with the GaAs substrate. That is, it becomes possible to form a device lattice-matched to GaAs and a device lattice-matched to InP the same substrate. Thus, it is possible to monolithically join electronic devices to each other, or optical devices to each other, or an electronic device with an optical device.

Figure 13:
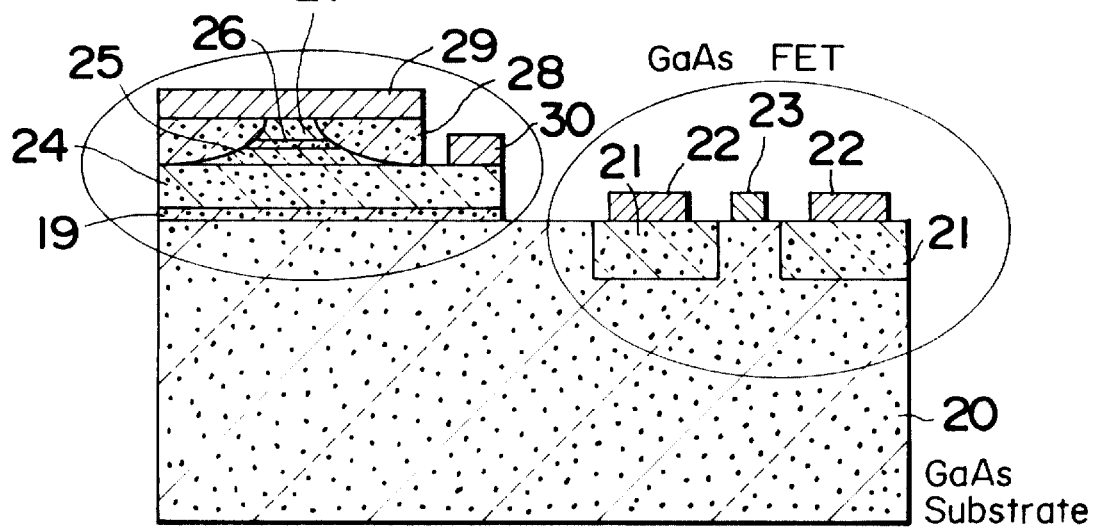
FIG. 13 is a cross-sectional view showing a structure of a monolithically formed electronic device/optical device according to Embodiment 5 of the present invention.
Figure 14:
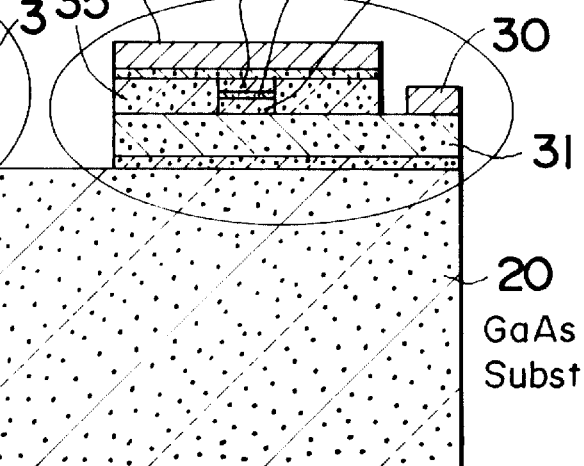
FIG. 14 is a cross-sectional view showing a structure of another monolithically formed electronic device/optical device according to Embodiment 5 of the present invention.
Figure 15:
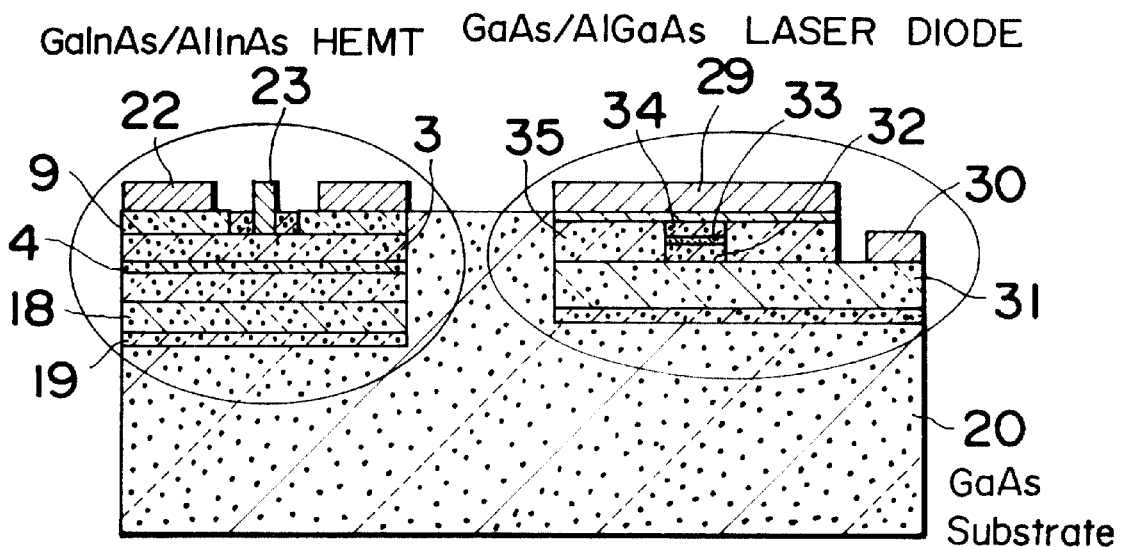
FIG. 15 is a cross-sectional view showing a structure of the monolithically formed electronic device/optical device active layer according to Embodiment 5 of the present invention.

FIG. 13, FIG. 14, and FIG. 15 respectively show a monolithically formed semiconductor hetero-structure.

In the semiconductor device structure shown in FIG. 13, a laser diode structure lattice-matched on InP is formed on a part of a GaAs wafer 20 also having an FET structure with source and drain regions 21, source and drain electrode 22 and a gate electrode 23 the laser diode is formed on the buffer layer 19 so the structure is an optical-electronic integrated device. One embodiment of the producing method will be explained hereinafter.

First, a GaAs FET structure is produced by forming a n-type source and drain region 21 on a semi-insulating GaAs substrate 20 by means of Si ion implantation. On the whole surface of the wafer, a basic structure of a laser diode (n-AlInAs buffer layer 24, n-InP cladding layer 25, undoped GaInAsP/GaInAs quantum well active layer 26, and p-InP cladding layer 27) is grown.

Then, the basic structure part of the laser diode on the upper part of the FET structure formation part is removed by selective etching and a part of the remaining basic structure of the laser diode is etched. Then, an undoped AlInAs current blocking layer 28 is formed selective embedding growth.

Lastly, electrodes 23, 23, 29 and 30 are formed on the FET structure and the laser diode structure. Thus, the producing step has been completed.

In this producing method, the basic structure of the laser diode is formed on the whole surface of the wafer on which the FET structure is formed. However, the FET structure formation part may be covered with an insulating film, followed by forming the buffer layer 19 on the laser diode formation part by selective growth.

In the semiconductor device structure shown in FIG. 14, the HEMT structure lattice-matched to InP is formed on a part of the GaAs wafer structure having the laser diode structure on the buffer layer 19 of the present invention, thereby constituting an optical-electronic integrated device. One embodiment of the production method.

First, on a semi-insulating GaAs substrate 20, a laser diode substrate structure (GaAs buffer layer 31 (not the buffer layer indicated by 19), a n-AlGaAs cladding layer 32, an undoped GaAs/AlGaAs quantum well active structure 33, a p-AlGaAs clad layer 34, and a n-GaAs current blocking layer 35) are formed.

A part of the basic structure part of the laser diode is etched by selective etching, and then an undoped AlInAs layer 18, a GaInAs layer 3, an AlInAs spacer layer 4, an AlInAs layer current supply layer 3 and a GaInAs ohmic contact layer 9 are grown by a selective growth method on the buffer layer of the present invention to form an HEMT structure.

Lastly, electrodes 29, 30, 22 and 23 are formed on the laser diode structure and the HEMT structure. Thus, the formation of an optical-electronic integrated device circuit has been completed.

In FIG. 15, on a partially etched GaAs substrate 20, a GaAs/AlGaAs laser diode and a GaInAs/AlInAs HEMT are formed by the same method as that shown in FIG. 14. By using such a structure, it also becomes possible to form an embedded type optical-electronic integrated device.

In such way, by using the buffer layer 19 of present invention, it becomes possible to form devices with different lattice constants on the GaAs substrate. Thus, it becomes possible to monolithically join electronic devices, optical devices or an electric device with the optical device, which are formed from different kinds of semiconductors.

Embodiment 6

In Embodiments 1 to 5, a semiconductor hetero-structure using an $Al_{0.48}In_{0.52}As$ layer as a single-composition buffer layer which absorbs and blocks almost all of lattice-misfit dislocations was explained with respect to the HEMT structure comprising the $Al_{0.48}In_{0.52}As$ layer formed on the GaAs layer or both $Ga_{0.47}In_{0.53}As$ layer and $Al_{0.48}In_{0.52}As$ layer. The layer formed on the buffer layer may have a structure comprising a GaInAs layer having an arbitrary composition, or an AlInAs layer having an arbitrary composition, or both a GaInAs layer and a AlInAs layer. A single-composition buffer layer, which absorbs and blocks almost all of lattice-misfit dislocations, arranged between GaAs and the formation layer may be a GaInAs layer or AlInAs layer of arbitrary composition.

When using the buffer layer of the present invention, it is possible to produce an $Al_{1-x}In_xAs/Ga_{1-y}In_yAs$ pseudomorphic (lattice pseudo-matched) HEMT on the GaAs substrate. Therefore, it becomes possible to reduce the dislocation density of the active layer of HEMT and to drastically improve the device characteristics.

What is claimed is:

1. A method of preparing an AlInAs/GaAs hetero-structure comprising:

forming an first $Al_{1-x}In_xAs$ (0<x<1) first buffer layer in an amorphous state on a GaAs substrate, annealing said first buffer layer in an amorphous state to crystallize said first buffer layer into a first single crystal buffer layer, forming a single crystal $Al_{1-x}In_xAs$ (0<x<1) second buffer layer on said first single crystal buffer layer, and forming a single crystal $Al_{1-x'}In_{x'}As$ (0<x'<1) active layer on said second single crystal buffer layer.

2. The method of preparing an AlInAs/GaAs hetero-structure according to claim 1, wherein annealing includes at least one heat-cool cycle of heating said first buffer layer from a forming temperature to the annealing temperature and cooling from the annealing temperature to the forming temperature to heat stress said first buffer layer.

3. The method of preparing an AlInAs/GaAs hetero-structure according to claim 1, including annealing at a temperature of at least 450° C.

4. The method of preparing an AlInAs/GaAs hetero-structure according to claim 1, including forming said first buffer layer at a temperature of about 200° C.

5. A method of preparing a GaInAs/GaAs hetero-structure comprising:

forming a $Ga_{1-y}In_yAs$ (0<y<1) first buffer layer in an amorphous state on a GaAs substrate, annealing said first buffer layer in an amorphous state to crystallize said first buffer layer into a first single crystal buffer layer, forming a single crystal $Ga_{1-y}In_yAs$ (0<y<1) second buffer layer on said first single crystal buffer layer, and forming a single crystal $Ga_{1-y'}In_{y'}As$ (0y'<1) active layer on said second single crystal buffer layer.

6. The method of preparing a GaInAs/GaAs hetero-structure according to claim 5, wherein annealing includes at least one heat-cool cycle of heating said first buffer layer from a forming temperature to the annealing temperature and cooling from the annealing temperature to the forming temperature to heat stress said first buffer layer.

7. The method of preparing a GaInAs/GaAs hetero-structure according to claim 5, including annealing at a temperature of at least 450° C.

* * * * *